(12) United States Patent
Henzler et al.

(10) Patent No.: US 8,830,104 B2
(45) Date of Patent: Sep. 9, 2014

(54) DATA CONVERTER HAVING A PASSIVE FILTER

(75) Inventors: Stephan Henzler, Taufkirchen (DE); Matthias Schoebinger, Munich (DE); Lajos Gazsi, Dusseldorf (DE)

(73) Assignee: Infineon Technologies AG, Neubiberg (DE)

( * ) Notice: Subject to any disclaimer, the term of this patent is extended or adjusted under 35 U.S.C. 154(b) by 277 days.

(21) Appl. No.: 13/187,975

(22) Filed: Jul. 21, 2011

(65) Prior Publication Data

US 2011/0279296 A1   Nov. 17, 2011

Related U.S. Application Data

(63) Continuation of application No. 12/615,994, filed on Nov. 10, 2009, now Pat. No. 8,018,366.

(51) Int. Cl.
*H03M 1/12* (2006.01)
(52) U.S. Cl.
USPC .......................................... 341/155; 341/143

(58) Field of Classification Search
USPC .................. 341/143, 144, 155, 120
See application file for complete search history.

(56) References Cited

U.S. PATENT DOCUMENTS

| 6,850,180 B2 * | 2/2005 | Hales | 341/162 |
| 6,864,817 B1 * | 3/2005 | Salvi et al. | 341/139 |
| 7,221,303 B1 * | 5/2007 | Melanson | 341/143 |
| 7,414,562 B2 * | 8/2008 | Kok et al. | 341/155 |

OTHER PUBLICATIONS

Prosecution from Parent U.S. Appl. No. 12/615,994, filed Nov. 10, 2009, and Patented 8,018,366, to include Dec. 14, 2010 Non-Final Rejection; and Dec. 14, 2010 List of references cited.

* cited by examiner

*Primary Examiner* — Brian Young
(74) *Attorney, Agent, or Firm* — SpryIP, LLC

(57) ABSTRACT

Exemplary implementations of electrical circuits and systems are disclosed, and methods for signal processing including sampling and quantizing of amplitude and band limited signals implemented through a Passive Pulse Modulation Analog to Digital Converter (PMADC).

20 Claims, 7 Drawing Sheets

DATA CONVERTER HAVING A PASSIVE FILTER

RELATED APPLICATIONS

This application is a Continuation application of U.S. application Ser. No. 12/615,994, which was filed on Nov. 10, 2009. The entire contents of the U.S. application Ser. No. 12/615,994 are hereby incorporated herein by reference.

BACKGROUND

It is often a goal of electronic designers to design circuits that utilize a low supply voltage and/or consume a minimum amount of power. This may particularly be the case for Analog to Digital Converters (ADC).

Various known techniques may reduce the high power consumption common to many ADC devices. Such techniques include a Pulse Modulation ADC using irregular sampling, as disclosed in United States Patent Application US 2009/0091486 A1, to Wiesbauer et al., which is incorporated herein in its entirety.

A contemporary Pulse Modulation ADC converts a continuous time analog signal into a discrete time digital signal. The Pulse Modulation ADC is primarily composed of a modulator and a measurement engine, and generally includes a demodulator or other digital signal processor. The Sigma-Delta configuration of the modulator of the contemporary Pulse Modulation ADC is characterized by the inclusion of active elements. Specifically, the modulator of the Pulse Modulation ADC generally includes an operational amplifier or operational transconductance amplifier acting as an integrator.

As the frequency of operation increases, the behavior of the active integrator becomes less ideal, and so the benefit (the linear response) of using an active element such as an operational amplifier in a summation function is generally lost, and the disadvantages to using the active element (increase in size and power consumption to maintain acceptable performance characteristics) become more apparent. Therefore, the Pulse Modulation ADC may still require a higher than desired supply voltage, and consume relatively more power, in addition to requiring greater circuit area. Any increase in the consumption of power and circuit area is usually not desirable, especially in implementations performed with 100 nm technology or smaller.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

Exemplary implementations of passive electrical circuits and systems are disclosed describing a high-resolution, high bandwidth streaming ADC that is based on time-domain resolution. Implementations are explained in more detail below using a plurality of examples. Although various implementations and examples are discussed here and below, further implementations and examples may be possible by combining the features and elements of individual ones.

Exemplary Systems

Figure 1:
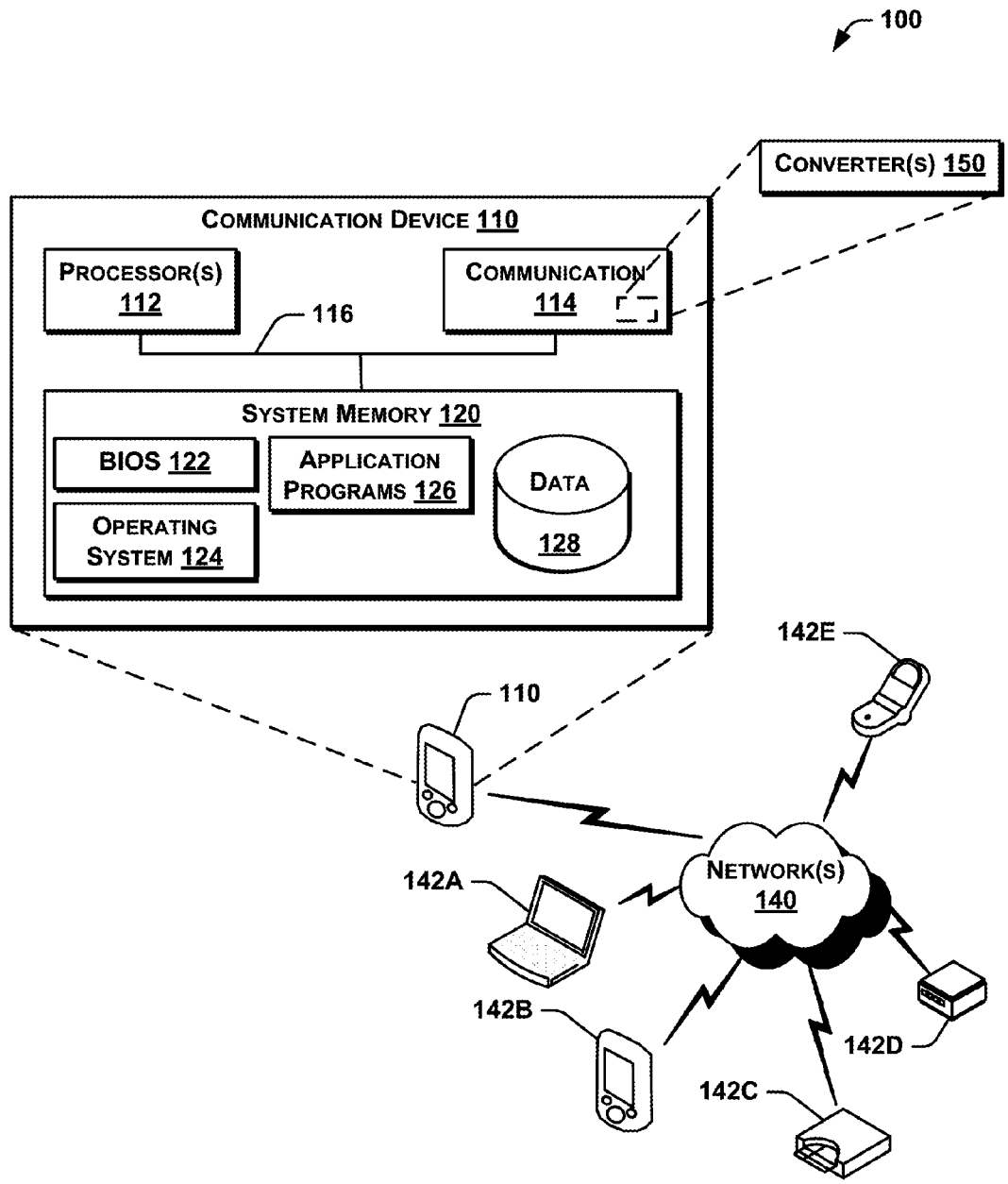
FIG. 1 is an exemplary environment in which techniques in accordance with the present disclosure may be implemented.

FIG. 1 illustrates an exemplary environment 100 in which techniques in accordance with the present disclosure may be implemented. In this implementation, the environment 100 includes a communication device 110, or other mobile and/or electronic device, having one or more analog to digital converter circuits 150 configured in accordance with the teachings of the present disclosure. The communication device 110 operatively communicates via one or more networks 140, such as wireless local area network (WLAN), with a plurality of other devices 142. Alternatively, the communication device 110 may bypass the networks 140 and communicate directly with one or more of the other devices 142. Detailed descriptions of various aspects of analog to digital converter circuits, methods, and techniques are provided in the following sections with reference to FIGS. 2 through 7.

In the representative environment 100, the communication device 110 is a hand-held device, such as an MP3 (Moving Picture Exerts Group Layer-3) player, a personal data assistant (PDA), a global positioning system (GPS) unit, mobile telephone, smartphone, or other similar hand-held device, and the other devices 142 may include, for example, a computer 142A, another hand-held device 142B, a compact disc (CD) or digital video disc (DVD) player 142C, a signal processor 142D (e.g., radio, navigational unit, television, etc.), and a mobile phone 142E. In alternative implementations, of course, the devices 110, 142 may include any other suitable devices, and it is understood that any of the plurality of devices 142 may be equipped with analog to digital converter circuits 150 that operate in accordance with the teachings of the present disclosure.

As further shown in FIG. 1, the communication device 110 includes one or more processors 112 and one or more communication components 114, such as input/output (I/O) devices (e.g., transceivers, transmitters, receivers, etc.), coupled to a system memory 120 by a bus 116. In the implementation shown in FIG. 1, the analog to digital converter circuit 150 is included as a component within the communication component 114 of the communication device 110. In alternative implementations, however, the analog to digital converter circuit 150 may be integrated with any other suitable portion of the device 110, or may be a separate, individual component of the device 110.

The system bus 116 of the communication device 110 represents any of the several types of bus structures, including a memory bus or memory controller, a peripheral bus, an accelerated graphics port, and a processor or local bus using any of a variety of bus architectures. The communication component 114 may be configured to operatively communicate with one or more external networks 140, such as a cellular telephone network, a satellite network, an information network (e.g., Internet, intranet, cellular network, cable network, fiber optic network, LAN, WAN, etc.), an infrared or radio wave communication network, or any other suitable network.

The system memory 120 may include computer-readable media configured to store data and/or program modules for implementing the techniques disclosed herein that are immediately accessible to and/or presently operated on by the processor 112. For example, the system memory 120 may also store a basic input/output system (BIOS) 122, an operating system 124, one or more application programs 126, and program data 128 that can be accessed by the processor 112 for performing various tasks desired by a user of the communication device 110.

Moreover, the computer-readable media included in the system memory 120 can be any available media that can be accessed by the device 110, including computer storage media and communication media. Computer storage media may include volatile and nonvolatile media, removable and non-removable media implemented in any method or technology for storage of information such as computer-readable instructions, data structures, program modules, or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVD) or other optical disk storage, magnetic cassettes, magnetic tape, magnetic disk storage or other magnetic storage devices, or any other medium, including paper, punch cards and the like, which can be used to store the desired information and which can be accessed by the communication device 110.

Similarly, communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection and wireless media such as acoustic, RF, infrared and other wireless media. Combinations of any of the above should also be included within the scope of computer readable media.

Generally, program modules executed on the device 110 (FIG. 1) may include routines, programs, objects, components, data structures, etc., for performing particular tasks or implementing particular abstract data types. These program modules and the like may be executed as a native code or may be downloaded and executed such as in a virtual machine or other just-in-time compilation execution environments. Typically, the functionality of the program modules may be combined or distributed as desired in various implementations.

Although the exemplary environment 100 is shown as in FIG. 1 as a communication network, this implementation is meant to serve only as a non-limiting example of a suitable environment for use of the analog to digital converter circuit 150 in accordance with present disclosure. Similarly, the device 110 is simply one non-limiting example of a suitable device that may include analog to digital converter circuits 150 in accordance with the present disclosure.

Exemplary Passive PMADC Implementations

Figure 2:
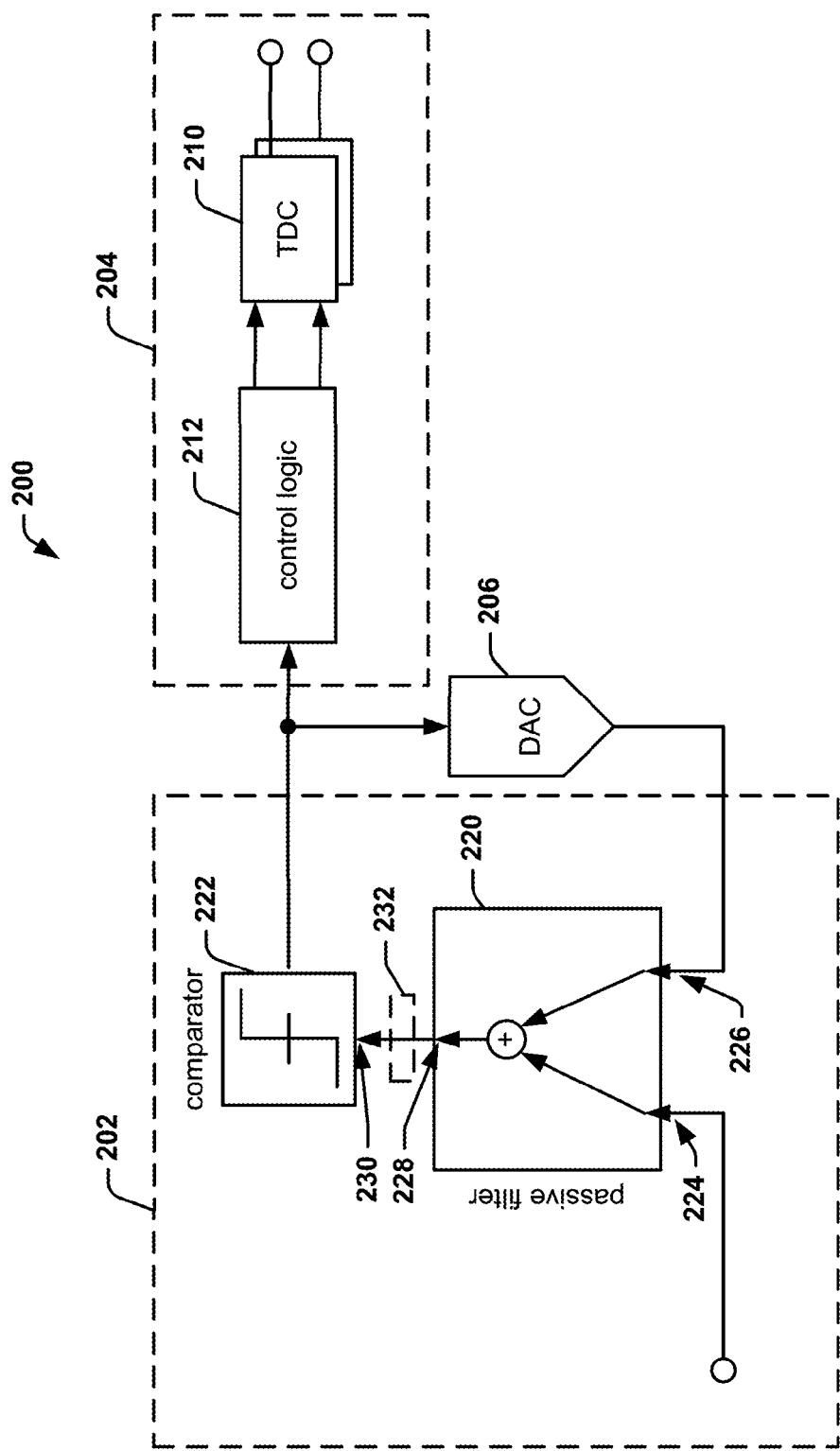
FIG. 2 illustrates an exemplary implementation of a Passive Pulse Modulation Analog to Digital Converter (PPMADC).

FIG. 2 illustrates an exemplary implementation of a Passive Pulse Modulated Analog to Digital Converter (PPMADC) 200. It is to be understood that the PPMADC 200 may be implemented as, or part of another system such as a TV tuner card, mobile communications systems, Bluetooth transmission systems, Very high speed Digital Subscriber Line (VDSL) systems, and the like. Because of its lower power consumption and area requirements due to the use of primarily passive elements (an active integrator is not included in the circuit), a PPMADC 200 may be implemented successfully in 100 nm or less technology operating at high frequencies (for example, hundreds of megahertz). In an exemplary embodiment, the PPMADC 200 is composed of a first stage comprising an analog modulator 202, and a second stage comprising a Measurement Engine 204.

Modulator

The modulator 202 converts an input analog signal into a corresponding pulse modulated digital signal using time-discrete irregular sampling of the input signal. The modulator 202 can convert the magnitude (for example amplitude information) of the input analog signal into time information in time domain. This is commonly referred to as Pulse Modulation (PM) or duty cycle modulation. The amplitude of the input signal may be converted into time encoded information in the instantaneous frequency and/or the duty cycle of a square wave by the modulator 202. For example, given low amplitudes of the input analog signal, the duty cycle of the output square wave may be low, and given high amplitudes of the input analog signal, the duty cycle of the output square wave may be high.

In an embodiment, the modulator 202 generates an asynchronous square wave with a duty cycle that is linearly dependent on the input analog signal. In addition, the modulator 202 can generate an instantaneous frequency, which is non-linearly dependent on the input analog signal. The modulator 202, in an exemplary asynchronous embodiment, may be implemented without any clock and can be operated at low currents and supply voltages. Further, as an advantage to asynchronous operation, the output signal of the modulator 202 may avoid errors introduced by quantization. Thus, the output signal of the modulator 202 is a better representation of the input analog signal.

In an exemplary embodiment, the modulator 202 includes a passive continuous time filter 220 and a comparator 222. The passive continuous time filter 220 may generally have two inputs, a first input 224 receiving an analog signal that is an input signal to the PPMADC circuit 200, and a second input 226 receiving a feedback signal. The passive continuous time filter 220 filters the input analog signal and the feedback signal, and also combines the signals received at the first and second inputs. The combined signal comprising the analog input received at the first input 224 and the feedback signal received at the second input 226 is the output signal of the passive continuous time filter 220 and the input signal to the comparator 222. In one embodiment, no other elements are in the signal path between the output 228 of the passive continuous time filter 220 and the input 230 to the comparator 222. In an alternate embodiment, an additional passive filter 232 is added to the signal path between the output 228 of the passive continuous time filter 220 and the input 230 to the comparator 222, providing additional filtering to the output signal of the passive continuous time filter 220.

It is advantageous to have a purely passive signal path from the input of the passive filter 220 to the input of the comparator 222. The benefits include lower power consumption by the circuit, less physical circuit area required, the ability to scale the circuit to smaller implementations (e.g., 100 nm or less technology), higher speed and bandwidth capabilities (e.g., hundreds of MHz), minimum voltage domain signal processing, high resolution, improved streaming capability, and the like. In exemplary embodiments of the PPMADC circuit 200, no active element is present in the signal path between the inputs 224 and 226 of the passive continuous time filter 220 and the input 230 to the comparator 222.

In an exemplary embodiment, the comparator 222 is the only active element of the first stage of the PPMADC 200. Additionally, the comparator 222 is usually asynchronous. The comparator 222 compares the output signal of the passive continuous time filter 220 with at least one reference voltage to produce an output signal. In general, a comparator, such as comparator 222, compares two input voltages or currents and switches its output to indicate which of the two inputs is larger. In this example, one of the signals received by the comparator 222 may be a reference voltage. In an embodiment, the combined signal received from the passive continuous time filter 220 is compared with a reference voltage by the comparator 222. The reference voltage may be a predefined value.

In an embodiment, the output signal from the comparator 222 can switch from low to high if the output signal from the passive continuous time filter 220 rises above the reference voltage. In another case, the output signal from the comparator 222 can switch from high to low if the output signal from the passive continuous time filter 220 drops below the reference voltage or remains unchanged. The output signal of the comparator 222 is a pulse modulated square wave. The passive continuous time filter 220 and the comparator 222 together convert the amplitude information of an input analog signal into time information in the pulse modulated square wave. In an embodiment, the comparator 222 may be a multi-bit comparator, resulting in multiple pulse modulated output signals, due to multiple levels (instead of just a high/low comparison). In the embodiment, each of the multiple pulse modulated output signals are measured individually.

Timing properties of the comparator output signal are varied based on the magnitude of the analog signal received at input 224 of the passive continuous time filter 220. Timing properties that are varied based on the magnitude of the analog signal include the instantaneous frequency of the comparator output signal, the duty cycle of the comparator output signal, or a combination of both the instantaneous frequency and the duty cycle of the comparator output signal.

In an implementation, the modulator 202 can be extended with a feedback loop. The feedback loop routes the comparator output signal through a Digital to Analog Converter (DAC) 206, and then to the second input 226 of the passive continuous time filter 220. The DAC 206 translates the comparator output signal into an analog voltage or current signal to be received at the second input 226 of the passive continuous time filter 220.

Measurement Engine

In an implementation, the comparator output signal is quantized by a Measurement Engine 204 that determines the timing properties of the continuous time signal at the output of the comparator 222. These timing properties describe the value of the analog input voltage at non-equidistant time instances, i.e. irregular sampling values. For example, as the pulse modulated (PM) signal varies in instantaneous frequency and duty cycle, the measurement results occur at non-equidistant time instances. The sampling values may be quantized, and the original signal may later be reconstructed in digital form by a digital signal processor.

The Measurement Engine 204 digitally measures the edges of the modulated signal (which is the square wave comparator output signal), and generates a sample each time a data transition edge in the square wave is detected. The Measurement Engine 204 provides measurement results of the modulated signal at irregular intervals. In the other words, the Measurement Engine 204 samples or measures at non-equidistant time instances. No clock input is needed by the Measurement Engine 204 to perform the sampling. Therefore, Measurement Engine 204 can provide high precision sampling without a clock signal, which reduces circuit activity of the Measurement Engine 204 and reduces power consumption of the PPMADC 200. Moreover, the measurement result is not corrupted by non-idealities of the clock signal, such as jitter.

Furthermore, the Measurement Engine 204 may be used for quantization of the comparator output signal. For example, the Measurement Engine 204 can quantize the comparator output signal into a signal with discrete integer values or symbols. Any suitable number of binary bits can be employed to quantize the comparator output signal. For larger bit numbers, the number of levels that the sampled signal can be quantized into is larger. Therefore, the quantization noise is lower. The Measurement Engine 204 can be designed with digital components, such as inverters and latches, which work at higher speeds and consume lower amounts of power as compared to analog components. In an alternate implementation, the Measurement Engine 204 may be designed using a mix of digital and analog components.

As illustrated in FIG. 2, the Measurement Engine 204 comprises a Time to Digital Converter (TDC) 210 and a control component 212. The TDC 210 extracts time encoded information from the comparator output signal. The control component 212 generates stop and start events from the comparator output signal. The generated start and stop events are necessary for the operation of the TDC 210, including controlling the starting and stopping of the TDC 210.

In one embodiment, the Measurement Engine 204 is comprised of a single TDC 210 that measures both the high and the low portions of the pulse width encoded comparator output signal. In an alternate embodiment, the Measurement Engine 204 is comprised of a plurality of TDCs 210. For example, one TDC 210 may be used to measure the high portions of the pulse width encoded comparator output signal, and another TDC 210 may be used to measure the low portions of the pulse width encoded comparator output signal (since the pulse width encoded comparator output signal is a square wave). In an exemplary embodiment, any and all TDCs 210 in a PPMADC 200 are controlled solely based on the time encoded information extracted from the comparator output signal.

Figure 3:
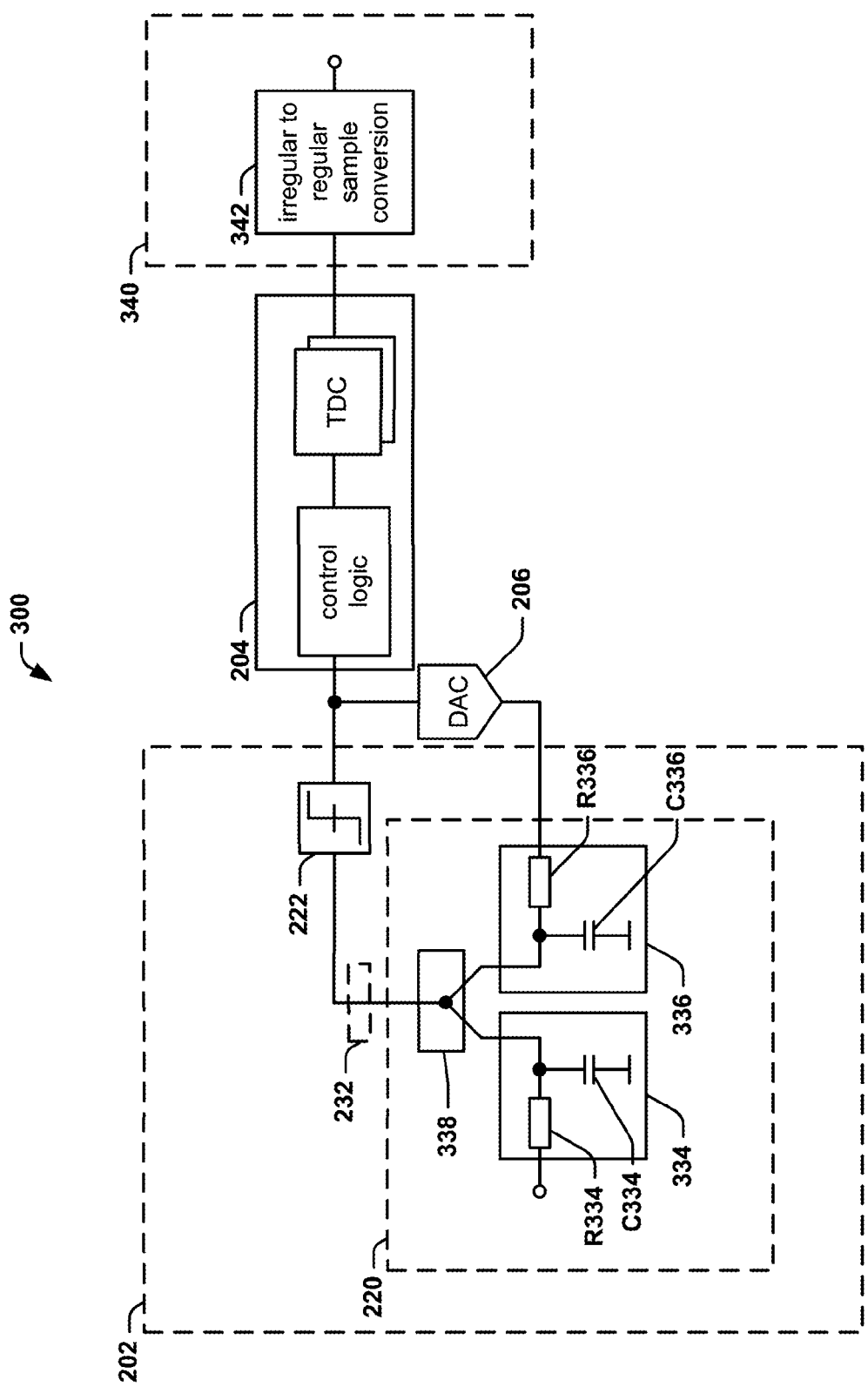
FIG. 3 illustrates an exemplary PPMADC.

FIG. 3 illustrates a circuit 300, comprising an embodiment of an exemplary PPMADC 200 with an Irregular to Regular Sample Converter (IRSC) 342 coupled to a single TDC 210 output. In an alternate embodiment, the circuit 300 may have multiple TDC 210 outputs. For example, one TDC 210 output may represent the instantaneous frequency of the encoded comparator output signal, and another TDC 210 output may represent the duty cycle of the encoded comparator output signal. The PPMADC 200 is comprised of a modulator 202 and a Measurement Engine 204. The modulator 202 is further comprised of a passive time continuous filter 220 and a comparator 222, and may also include a DAC 206.

FIG. 3 also illustrates detail of an exemplary passive time continuous filter 220. In the illustrated embodiment, the passive time continuous filter 220 provides an input signal to the comparator 222. The passive time continuous filter 220 comprises a first passive sub-filter 334, a second passive sub-filter 336, and a summing node 338. The first passive sub-filter 334 receives an analog signal that is an input signal to the circuit 300. As an example, the input analog signal can include voice signals or data signals, and/or a combination of the two. In case of a voice signal, the analog source of the signal may be a microphone. If the signal is a data signal, then the analog input signals may be audio and/or video transmission signals, or the like. The second passive sub-filter 336 receives a feedback signal. The feedback signal originates as the output signal of the comparator 222, is translated by the DAC 206, and is fed into the second passive sub-filter 336.

As further illustrated in FIG. 3, the first and second passive sub-filters 334 and 336 are composed of passive elements, including resistors and/or capacitors, and do not require active devices. The first and second passive sub-filters 334 and 336 may be composed of resistive elements R334 and R336 respectively, and capacitive elements C334 and C336 respectively. Resistive elements R334 and R336 as shown in FIG. 3 may be composed of multiple passive resistors and/or passive resistive elements. Capacitive elements C334 and C336 as shown in FIG. 3 may be composed of multiple passive capacitors and/or passive capacitive elements. An exemplary circuit showing typical resistors and capacitors employed as resistive elements R334 and R336 and capacitive elements C334 and C336 respectively is illustrated below in FIG. 5.

In an exemplary embodiment, the output signal of the first passive sub-filter 334 is combined with the output signal of the second passive sub-filter 336 at the summing node 338. The output signal of the summing node 338 is the input signal to the comparator 222. This means that the input signal to the comparator 222 is a combination of the analog signal that is input to the circuit 300 filtered by the first passive sub-filter 334, and the feedback signal received at the input to the second passive sub-filter 336 filtered by the second passive sub-filter 336. Thus, the passive continuous time filter 220 directly provides an input signal to the comparator 222.

As explained above, in one alternate embodiment, a third passive sub-filter 232 may be coupled to the output of the summing node 338. The third passive sub-filter 232 may passively filter the output signal of the summing node 338 prior to the signal being received by the comparator 222. In one embodiment, the third passive sub-filter 222 is a capacitor (not shown) connected to the summing node 338. Thus, in all exemplary embodiments, only passive elements are in the signal path between the inputs to the passive sub-filters 334 and 336 and the input to the comparator 222.

In an exemplary embodiment, the comparator 222 compares the output signal of the summing node 338 and at least one reference voltage. Additionally, the comparator 222 is generally asynchronous. Timing properties of the comparator output signal are varied based on the magnitude of the input analog signal received at the first passive sub-filter 334. Timing properties that are varied based on the magnitude of the analog signal include the instantaneous frequency of the comparator output signal, the duty cycle of the comparator output signal, or a combination of both the instantaneous frequency and the duty cycle of the comparator output signal.

In an exemplary embodiment, the DAC 206 is coupled in series between the comparator and the second passive sub-filter 336. The DAC 206 translates the output signal of the comparator 222 into a voltage or current signal configured to be received by the second passive sub-filter 336. Thus, the output signal of the DAC 206 is the feedback signal received by the second passive sub-filter 336.

Demodulation

In an exemplary implementation, the comparator output signal is digitized by a Measurement Engine 204 that provides measurement values of the output of the comparator 222 at non-equidistant discrete times and generates irregular sampling values. The Measurement Engine 204 is coupled to the output of the comparator, and extracts timing information from the output signal of the comparator 222. In an implementation, the Measurement Engine 204 extracts all control events for the extraction of the timing information solely from the output signal of the comparator 222.

Once the Measurement Engine 204 quantizes the modulated comparator output signal, the operations that follow may be purely digital. In an exemplary embodiment, a post processing circuit 340 comprising an Irregular to Regular Sample Converter (IRSC) 342 is coupled to the output of the Measurement Engine 204. The post processing circuit 340 converts non-equidistant timing information from the output signal of the comparator 222 into equally spaced discrete values that represent sampling values of the analog signal received by the first passive sub-filter 334. The output of the Measurement Engine 204 provides information regarding the original input analog signal in the measured edge positions and/or pulse width of the square wave. The input analog signal can be reconstructed in the digital domain by the IRSC 342. The IRSC 342 can include a demodulator (not shown). In certain implementations, conversion of an irregular output (sampling) of the Measurement Engine 204 to an equidistant sampling may be performed by the demodulator.

Figure 4:
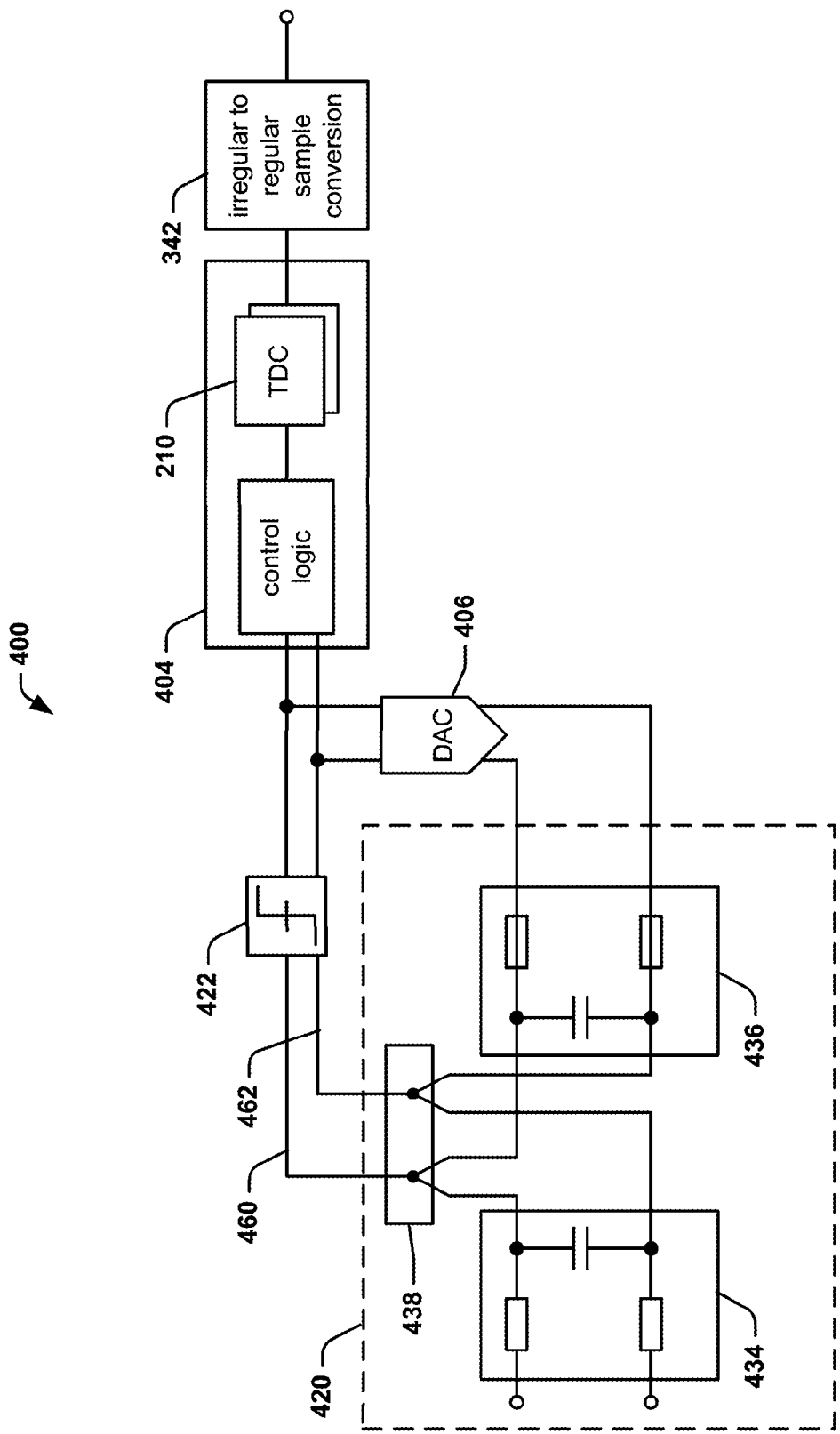
FIG. 4 illustrates a differential implementation of an exemplary PPMADC.

FIG. 4 illustrates a circuit 400, comprising a differential implementation of an exemplary PPMADC 200 with an Irregular to Regular Sample Converter (IRSC) 342 coupled to a TDC 210 output. FIG. 4 also illustrates detail of an exemplary passive time continuous filter 420 with parallel paths for differential operation. The basic operation of the circuit 400 is similar to the operation of the circuit 300, but includes fully differential signal paths. Two analog signals are input to the first passive continuous time filter 434, and two feedback signals are fed to the second passive continuous time filter 436. In an embodiment, the two input analog signals may include a first input analog signal and a second input analog signal. In an alternate embodiment, the second input analog signal may be a reference signal.

The first input analog signal is combined with a first feedback signal, and the second input analog signal is combined with a second feedback signal at the summing node 438, creating a first combined signal (illustrated on signal path 460) and a second combined signal (illustrated on signal path 462). In an exemplary embodiment, the first and second combined signals at the output of the summing node are received directly by the comparator 422. In an alternative embodiment, the first and second combined signals at the output of the summing node are filtered by a third passive time continuous filter (not shown) prior to being received by the comparator 422. The third passive time continuous filter may be comprised of a passive capacitive element connected to the first and second combined signals. Thus, in all exemplary embodiments, only passive elements are in the signal paths between the inputs of the first and second passive continuous time filters 434 and 436, and the input to the comparator 422.

In an exemplary embodiment, the comparator 422 is the only active element of the first stage or the second stage of the PPMADC 400. Additionally, the comparator 422 is generally asynchronous. The comparator 422 compares the first and second combined output signals to at least one reference signal, and outputs a pair of pulse modulated output signals. Timing properties of the comparator output signals are varied based on the magnitude of the analog signals received at the first and second inputs of the first passive continuous time filter 434. Timing properties that are varied based on the magnitude of the input analog signals include the instantaneous frequency of the comparator output signals, the duty cycle of the comparator output signals, or a combination of both the instantaneous frequency and the duty cycle of the comparator output signals.

First and second comparator output signals (PWM square wave signals) are passed to a Measurement Engine 404 for extraction of time encoded information as described above. Additionally, the first and second comparator output signals are translated by a DAC 406 and passed to the inputs of the second passive continuous time filter 436 as feedback signals. As described above, the DAC 406 translates the comparator output signals into analog voltage or current signals to be received by the second passive continuous time filter 436. In an embodiment, the first comparator output signal becomes the first feedback signal at the second passive time continuous filter 436, and the second comparator output signal becomes the second feedback signal at the second passive time continuous filter 436. In an alternate embodiment, the first comparator output signal becomes the second feedback signal at the second passive time continuous filter 436, and the second comparator output signal becomes the first feedback signal at the second passive time continuous filter 436.

Figure 5:
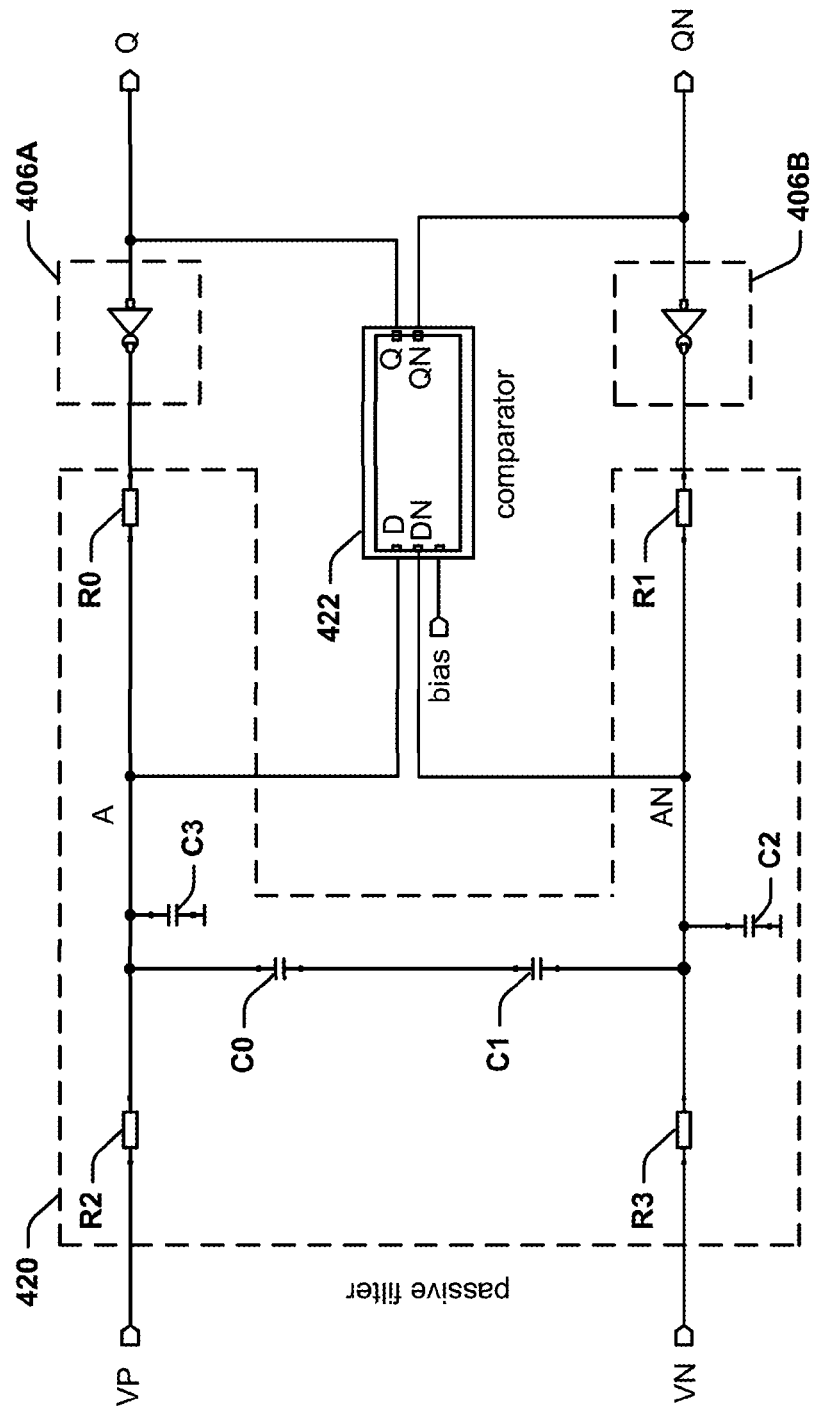
FIG. 5 illustrates a circuit diagram of the modulator stage of the PPMADC shown in FIG. 4.

FIG. 5 illustrates a circuit diagram of the passive continuous time filter 420, the comparator 422, and the DAC 406 (shown in two parts as 406A and 406B) of circuit 400 as described above with reference to FIG. 4. The circuit diagram illustrates the differential inputs and plural paths as described above. Two analog signals VP and VN are input to the first passive continuous time filter 434. The first passive continuous time filter 434 is shown in FIG. 5 as passive RC filters comprising R2, C0, and C3 and R3, C1, and C2. R2 and R3 represent passive resistive element R334 and C0, C1, C2, and C3 represent passive capacitive element C334 as discussed above with reference to FIG. 3. In an embodiment, the two input analog signals VP and VN may include a first input analog signal and a second input analog signal. In an alternate embodiment, the second input analog signal VN may be a reference signal. Two feedback signals Q and QN are fed to the second passive continuous time filter 436. The second passive continuous time filter 436 is shown in FIG. 5 as passive RC filters comprising R0 and C0 and R1 and C1. R0 and R1 represent passive resistive element R336 and C0 and C1 represent passive capacitive element C336 as discussed above with reference to FIG. 3. Note that the capacitors C0 and C1 are shared by both filters 434 and 436 in this implementation. In alternate embodiments, the filters 434 and 436 may not share common components.

The first input analog signal VP is combined with a first feedback signal Q at node A, and the second input analog signal VN is combined with a second feedback signal QN at node AN, creating a first combined signal D and a second combined signal DN. In the exemplary embodiment illustrated in FIG. 5, the first and second combined signals at the output of the summing node, D and DN, are received directly by the comparator 422. In an alternative embodiment the first and second combined signals at the output of the summing node, D and DN, may be filtered by a third passive time continuous filter (not shown) prior to being received by the comparator 422. Thus, in all exemplary embodiments, only passive elements are in the signal paths between the inputs of the first and second passive continuous time filters 434 and 436, and the input to the comparator 422.

In the exemplary embodiment shown in FIG. 5, the comparator 422 is the only active element of the modulator stage of the PPMADC 400. In an exemplary embodiment, the comparator 422 may be comprised of an integrated circuit as illustrated in FIG. 5. In alternate embodiments, the comparator may be comprised of discrete electrical components, or a mixture of discrete components and integrated circuits. Additionally, the comparator 422 is generally asynchronous. The comparator 422 outputs a pair of pulse modulated output signals Q and QN. The comparator 422 compares the first and second combined output signals and sets its output signals Q and QN depending on whether the voltage of D is greater or lesser than the voltage of DN. Timing properties of the comparator output signals Q and QN are varied by the comparator 422 based on the magnitude of the analog signals VP and VN received at the first and second inputs of the first passive continuous time filter 434. Timing properties that are varied based on the magnitude of the input analog signals VP and VN include the instantaneous frequency of the comparator output signals Q and QN, the duty cycle of the comparator output signals Q and QN, or a combination of both the instantaneous frequency and the duty cycle of the comparator output signals Q and QN.

First and second comparator output signals Q and QN are passed to a measurement engine (not shown) for extraction of time encoded information as described above. Additionally, the first and second comparator output signals Q and QN are translated by the DAC 406A and 406B and passed to the inputs of the second passive continuous time filter 436 as feedback signals. As described above, the DAC 406A and 406B translates the comparator output signals Q and QN into analog voltage or current signals to be received by the second passive continuous time filter 436. In an exemplary embodiment, the DAC 406A and 406B may be comprised of a pair of inverters/buffers as shown in the circuit diagram of FIG. 5. In an embodiment, the first comparator output signal Q becomes the first feedback signal D at the second passive time continuous filter 436, and the second comparator output signal QN becomes the second feedback signal QN at the second passive time continuous filter 436. In an alternate embodiment, the first comparator output signal Q becomes the second feedback signal DN at the second passive time continuous filter 436, and the second comparator output signal QN becomes the first feedback signal D at the second passive time continuous filter 436.

Exemplary Methods

Figure 6:
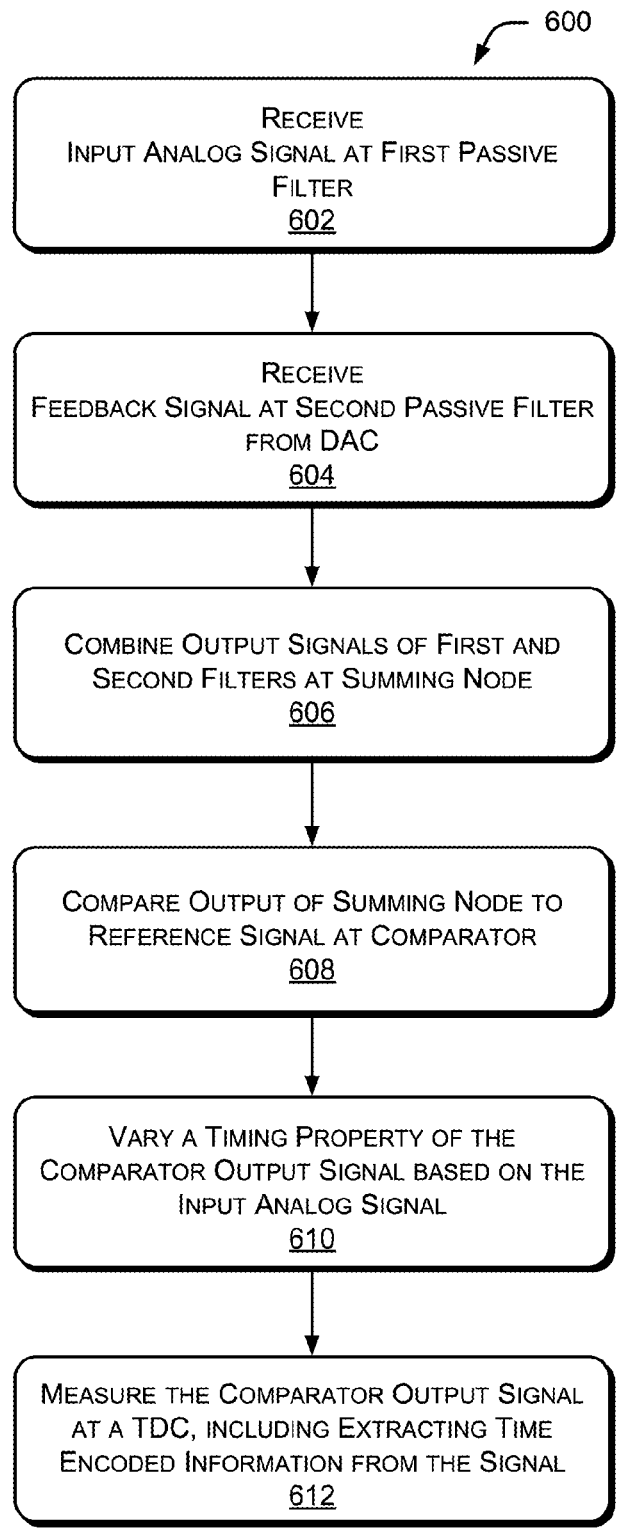
FIG. 6 illustrates a flow diagram for implementing analog to digital conversion using an exemplary PPMADC circuit.

FIG. 6 illustrates an exemplary method 600 for implementing analog to digital conversion using Passive Pulse Modulation Analog to Digital Conversion (PPMADC) and is described with reference to FIGS. 3-6. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method can be implemented in any suitable hardware, software, firmware, or a combination thereof, without departing from the scope of the invention.

At block 602, an input analog signal is received at a first passive continuous time filter. The received input analog signal may include voice signals or data signals, and/or a combination of the two. In case of a voice signal, the analog source may be a microphone. If the signal is a data signal, then the analog input signals may be audio and/or video transmission signals, or the like.

At block 604, a feedback signal is received at a second passive continuous time filter. The feedback signal is received from a Digital to Analog Converter (DAC). The DAC receives the feedback signal from the output of a comparator, and translates the comparator output signal to an analog voltage or current signal prior to sending the signal to the second passive continuous time filter. Block 604 may be simultaneous with block 602, such that the input analog signal is received at the first passive continuous time filter simultaneous to the feedback signal being received at the second passive continuous time filter.

At block 606, the output signal from the first passive continuous time filter and the output signal from the second passive continuous time filter are combined at a summing node. In an exemplary implementation, the summing node is not comprised of an active element.

At block 608, the combined signal at the output of the summing node is compared to at least one reference voltage at the comparator. The combined signal at the output of the summing node comprises the output signal from the first passive continuous time filter combined with the output signal from the second passive continuous time filter. In one embodiment, the comparator is asynchronous. In an alternate embodiment, the comparator is synchronous. In an embodiment, the combined signal at the output of the summing node is filtered, at a third passive continuous time filter, prior to being compared to at least one reference voltage at the comparator. The reference voltage can be a predefined value.

At block 610, a timing property of the output signal from the comparator is varied based on a magnitude of the analog signal received by the first passive continuous time filter. In one embodiment, the timing property of the output signal of the comparator that is varied is the instantaneous frequency of the output signal of the comparator. In another embodiment, the timing property of the output signal of the comparator that is varied is the duty cycle of the output signal of the comparator. In a further embodiment, the timing property of the output signal of the comparator that is varied is both the instantaneous frequency of the output signal of the comparator and the duty cycle of the output signal of the comparator. For example, the input analog signal may be modulated using modulator 202. The modulator 202 can convert the magnitude (for example amplitude information) of the input analog signal into time information of the comparator output signal using pulse modulation or duty cycle modulation. As a result, variations in the amplitude of the input analog signal are converted into variations of the pulse width and pulse period of the comparator output signal. The output of the modulator 202 can be an asynchronous time continuous square wave.

At block 612, the output signal from the comparator is measured. The measuring first comprises receiving the comparator output signal at a Time-to-Digital Converter (TDC). The output signal from the comparator is also routed to a control module that is configured to control the TDC. The control module generates start and stop events for the TDC based on the comparator output signal. Using these generated control events, the TDC then extracts time encoded information from the comparator output signal.

In an alternate embodiment, a plurality of TDCs may extract the time encoded information from the comparator output signal. For example, two TDCs may be used to perform the extraction. A first TDC may be used to extract information relative to the varying pulse width of the comparator output signal, and a second TDC may be used to extract information relative to the varying duty cycle of the comparator output signal. This may directly correspond to the first TDC measuring the duration of the pulse in a high state, and the second TDC measuring the duration of the low state between pulses. In an exemplary embodiment, any and all TDCs are controlled solely based on the control events extracted from the comparator output signal, and not from any third-party signal.

Exemplary Electronic Device

Figure 7:
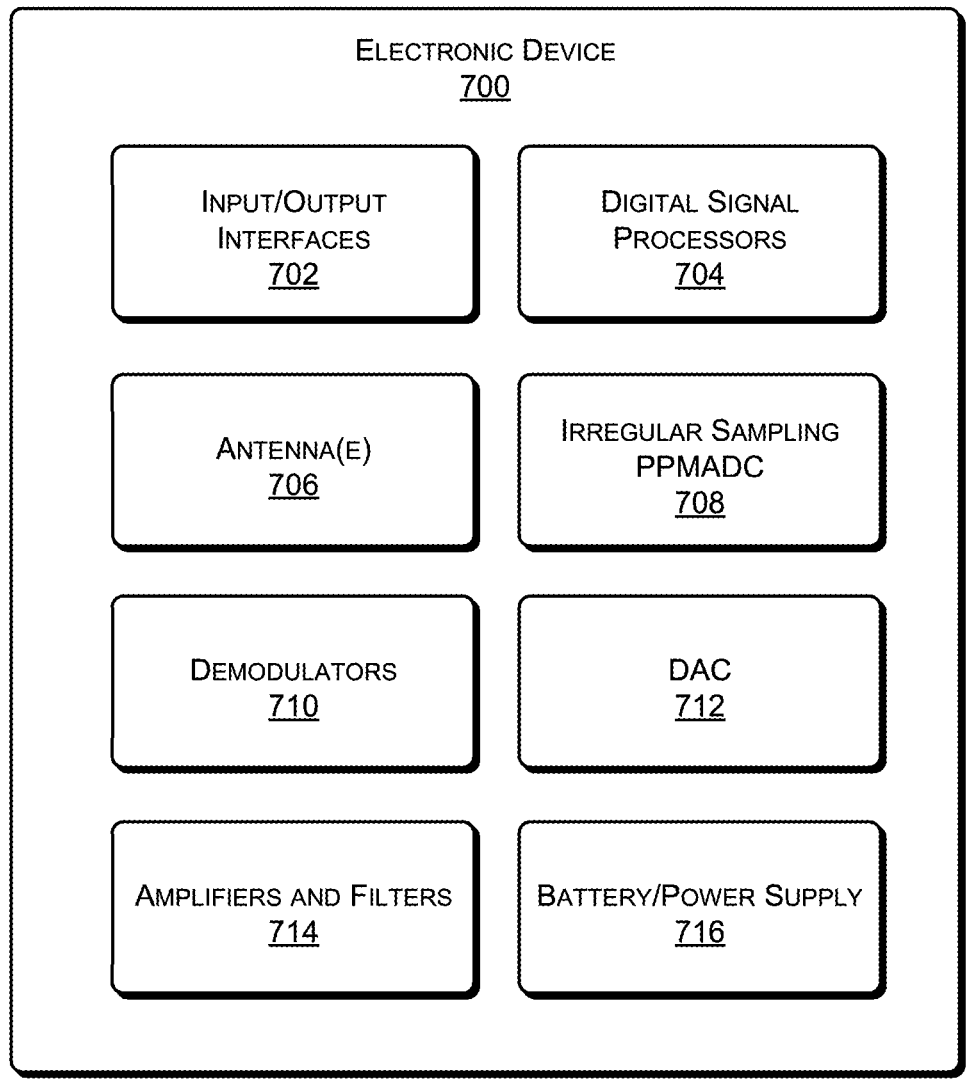
FIG. 7 illustrates an electronic device implementing a Passive Pulse Modulated Analog to Digital Converter using irregular sampling.

FIG. 7 illustrates an embodiment of an electronic device 700 implementing analog to digital conversion using a Passive Pulse Modulated Analog to Digital Converter (PPMADC). The electronic device 700 can include one or more input/output interfaces 702 and Digital Signal processor(s) DSP 704. Input/output interfaces 702 can be used to connect input/output devices such as such as a microphone, a user screen, a user interface (e.g., keypad, touchpad, etc.), speakers, and so on to the electronic device 700. The one or more digital signal processors 704 can perform control and command functions, including accessing and controlling the components of the electronic device 700. Digital Signal Processor (s) 704 can be a single processing unit or multiple computing units.

The electronic device 700 can further include one or more antennae 706 for transmitting and receiving radio frequency. The antennae 706 may be configured to receive different radio frequencies (RF) in different bands. The antenna 706 can include smart antennas, fractal antennas, microstrip antenna, and so on.

The electronic device 700 includes an irregular sampling PPMADC 708 that can convert an input analog signal received via the input/output interfaces 702 into a digital signal. The irregular sampling analog to digital converter 708 may include Modulator 202, Measurement Engine 204 and IRSC 342. In an exemplary implementation, the comparator 222 is the only active element comprising the modulator 202.

The analog signal can first be modulated to generate asynchronous square waves with varying pulse width and period in accordance with the amplitude of the analog signal. This modulated signal is then measured to generate irregular samples. The sampled signal can be quantized before it is utilized to reconstruct the original signal sample by sample in digital form or a digital signal.

Demodulators 710 can be included in the electronic device 700 in order to demodulate the signal received via the antenna, and strip off the carried frequency to obtain a baseband digital signal representing the input analog signal.

The baseband digital signal can be converted into an analog form. Converting to analog may be performed using a Digital to Analog Converter (DAC) 712. Any suitable DAC 712 can be used in the electronic device 700. For example, Binary weighted DAC, over sampling DAC, pulse width modulating DAC, segmented DAC, and so on. The choice of the DAC 712 may depend on the technology used, the frequency of the signal, the precision and accuracy demanded and so on.

Amplifiers and filters 714 may also be present in the electronic device 700 to amplify the signal and minimize the noise and distortion of the signal in the useful band. The amplifiers can be power amplifiers, audio/video amplifiers, and so on. The filters in the electronic device 700 can include pre filters, noise shapers, digital filters, analog filters and so on. The electronic device 700 also includes a battery or power supply 716 that provides power to the electronic device.

Conclusion

Although the invention has been described in language specific to structural features and/or methodological acts, it is to be understood that the invention is not necessarily limited to the specific features or acts described. Rather, the specific features and acts are disclosed as exemplary forms of implementing the invention.

What is claimed is:

1. An Analog to Digital Converter (ADC) electrical circuit including an analog modulator, the analog modulator comprising:
   a passive continuous time filter to:
   receive an analog signal,
   to receive a feedback signal, and
   to provide an output signal; and an asynchronous comparator configured to receive the output signal, the comparator further configured to vary a timing property of an output signal of the comparator based on a magnitude of the analog signal received by the passive continuous time filter.

2. The ADC electrical circuit of claim 1, further comprising:
a Digital to Analog Converter (DAC) coupled in series between the asynchronous comparator and the passive continuous time filter, the DAC configured to translate the output signal of the comparator into a voltage or current signal configured to be received by the passive continuous time filter, wherein an output signal of the DAC is the feedback signal to be received by the passive continuous time filter.

3. The ADC electrical circuit of claim 2, further comprising:
a measurement engine coupled to the output of the asynchronous comparator, the measurement engine configured to extract timing information from the output signal of the asynchronous comparator, and to extract control events for the extraction of the timing information from the output signal of the asynchronous comparator.

4. The ADC electrical circuit of claim 3, further comprising:
a post processing circuit coupled to the measurement engine, the post processing circuit configured to convert non-equidistant timing information from the output signal of the asynchronous comparator into equally spaced discrete values that represent sampling values of the analog signal received by the passive continuous time filter.

5. The ADC electrical circuit of claim 1, wherein the passive continuous time filter includes a first passive sub-filter to receive the analog signal and a second passive sub-filter to receive the feedback signal.

6. The ADC electrical circuit of claim 1, wherein the timing property is an instantaneous frequency of the output signal of the asynchronous comparator.

7. The ADC electrical circuit of claim 1, wherein the timing property is a duty cycle of the output signal of the asynchronous comparator.

8. The ADC electrical circuit of claim 1, wherein the timing property represents the analog signal received by the passive continuous time filter at a sampling point within a respective cycle of the output signal of the comparator.

9. The ADC electrical circuit of claim 1, wherein the passive continuous time filter includes a first passive sub-filter to receive the analog signal, a second passive sub-filter to receive the feedback signal, and a summing node to combine outputs signals from the first and second passive sub-filters to provide the output signal.

10. A method comprising:
receiving an analog signal at a filter, the filter providing a first output signal;
receiving a feedback signal from a Digital to Analog Converter (DAC) at the filter, the filter providing a second output signal;
combining the first output signal and the second output signal to provide a third output signal;
comparing the third output signal with at least one reference voltage; and
varying a timing property of a signal output by an asynchronous comparator based on a magnitude of the analog signal received by the filter.

11. The method of claim 10, further comprising measuring the signal output by the comparator by:
receiving the signal output by comparator at a Time-to-Digital Converter (TDC); and
extracting time encoded information from the signal output by the asynchronous comparator using start and stop events based on the signal output by the asynchronous comparator.

12. The method of claim 11, wherein the receiving and the extracting is performed by a plurality of TDCs, and wherein the TDCs are controlled solely based on control events extracted from the signal output by the asynchronous comparator.

13. The method of claim 10, wherein the timing property is an instantaneous frequency of the output signal of the asynchronous comparator.

14. The method of claim 10, wherein the timing property is a duty cycle of the output signal of the asynchronous comparator.

15. The method of claim 10, further comprising filtering the third output signal prior to the comparing.

16. An apparatus comprising:
a first stage, including:
a filter having at least one input and an output, the input configured to receive an analog signal, the at least one input further configured to receive a feedback signal, and the output configured to provide an output signal based on the analog signal and the feedback signal,
a comparator configured to compare the output signal of the filter and at least one reference voltage to provide a comparator output signal, wherein a timing property of the comparator output signal is varied based on a magnitude of the analog signal received by the at least one input, and
a Digital to Analog Converter (DAC) configured to convert the comparator output signal into the feedback signal to be received by the at least one input; and
a second stage comprising a Time-to-Digital Converter (TDC) and a control component, the TDC configured to extract time encoded information from the comparator output signal, and the control component configured to generate start and stop events from the comparator output signal.

17. The apparatus of claim 16, wherein the timing property is an instantaneous frequency of the comparator output signal.

18. The apparatus of claim 16, wherein the timing property is a duty cycle of the comparator output signal.

19. The apparatus of claim 16, wherein the comparator is an asynchronous comparator.

20. The apparatus of claim 16, further comprising a plurality of TDCs, wherein the TDCs are controlled solely based on the time encoded information extracted from the comparator output signal.

* * * * *